United States Patent
Darrer

(10) Patent No.: US 7,257,031 B2
(45) Date of Patent: Aug. 14, 2007

(54) CIRCUIT ARRANGEMENT AND METHOD FOR SWITCHING HIGH-VOLTAGE SIGNALS BY MEANS OF LOW-VOLTAGE SIGNALS

(75) Inventor: Franz Michael Darrer, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/233,506

(22) Filed: Sep. 22, 2005

(65) Prior Publication Data

US 2006/0133163 A1  Jun. 22, 2006

(30) Foreign Application Priority Data

Sep. 22, 2004  (DE) .............. 10 2004 045 903

(51) Int. Cl.
*G11C 16/06* (2006.01)
(52) U.S. Cl. .......................... 365/185.23; 365/189.05; 365/189.12; 365/230.08
(58) Field of Classification Search ........... 365/185.23, 365/189.05, 189.12, 230.08
See application file for complete search history.

(56) References Cited

U.S. PATENT DOCUMENTS 4,982,111 A * 1/1991 Nakaizumi ................. 327/208
5,265,052 A 11/1993 D'Arrigo et al.
6,489,828 B1 * 12/2002 Wang et al. ................. 327/333
6,556,061 B1 * 4/2003 Chen et al. ................. 327/333
6,801,053 B2 * 10/2004 Sun ............................ 326/68

FOREIGN PATENT DOCUMENTS

| DE | 197 14 658 C2 | 10/1998 |
|----|---------------|---------|
| JP | 06338197 A | 12/1994 |
| JP | 10011989 A | 1/1998 |

* cited by examiner

*Primary Examiner*—Connie C. Yoha
(74) *Attorney, Agent, or Firm*—Maginot, Moore & Beck

(57) ABSTRACT

The invention relates to a circuit arrangement for switching high-voltage signals with low-voltage signals, particularly for driving a semiconductor memory arrangement, comprising a low-voltage logic device for generating a low-voltage signal with a first predetermined logic level and with a second predetermined logic level, comprising a latch for receiving and latching the low-voltage signal and for outputting an output signal with a voltage dependent on the logic level of the received low-voltage signal, comprising a level shifter for increasing the value of the voltage of the latched low-voltage signal to a voltage of a high-voltage signal, as a result of which the voltage of the output signal output essentially rises to the voltage of the high-voltage signal, the latch exhibiting one or more high-voltage transistors.

19 Claims, 10 Drawing Sheets

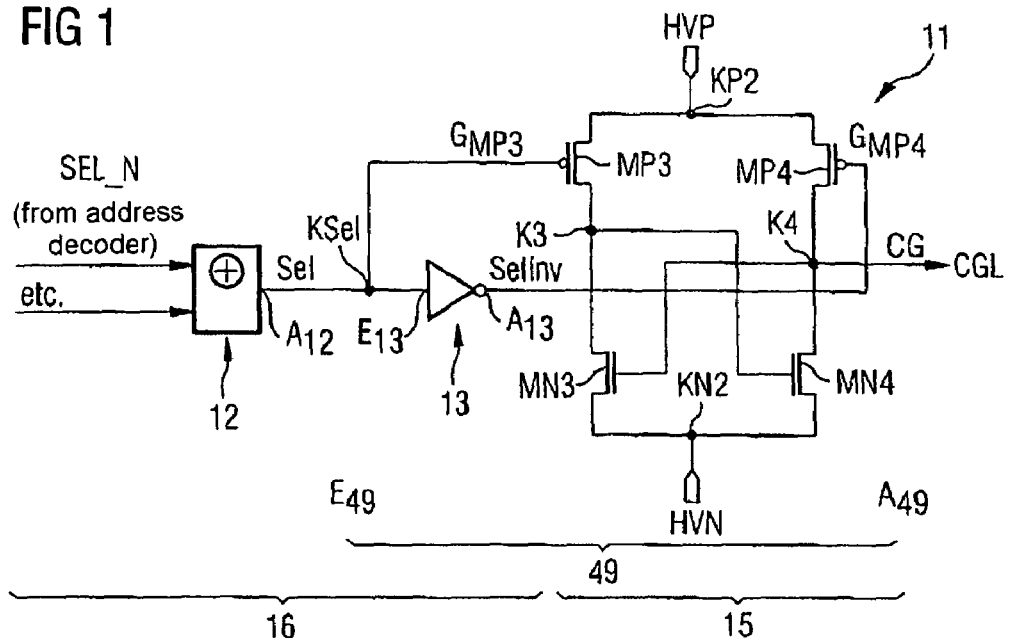
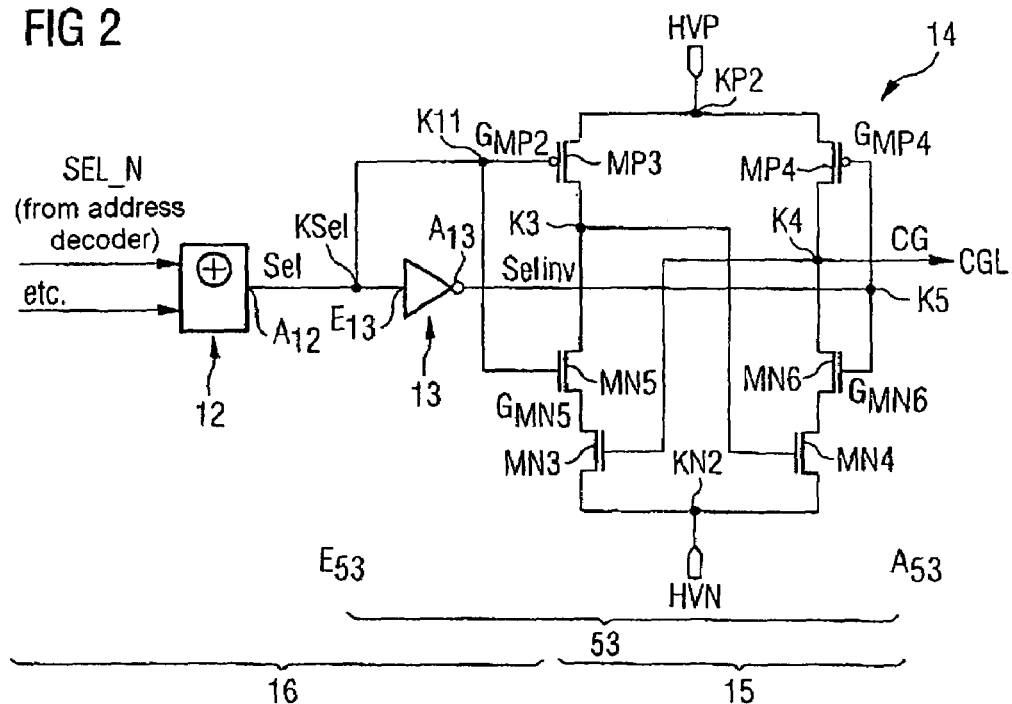

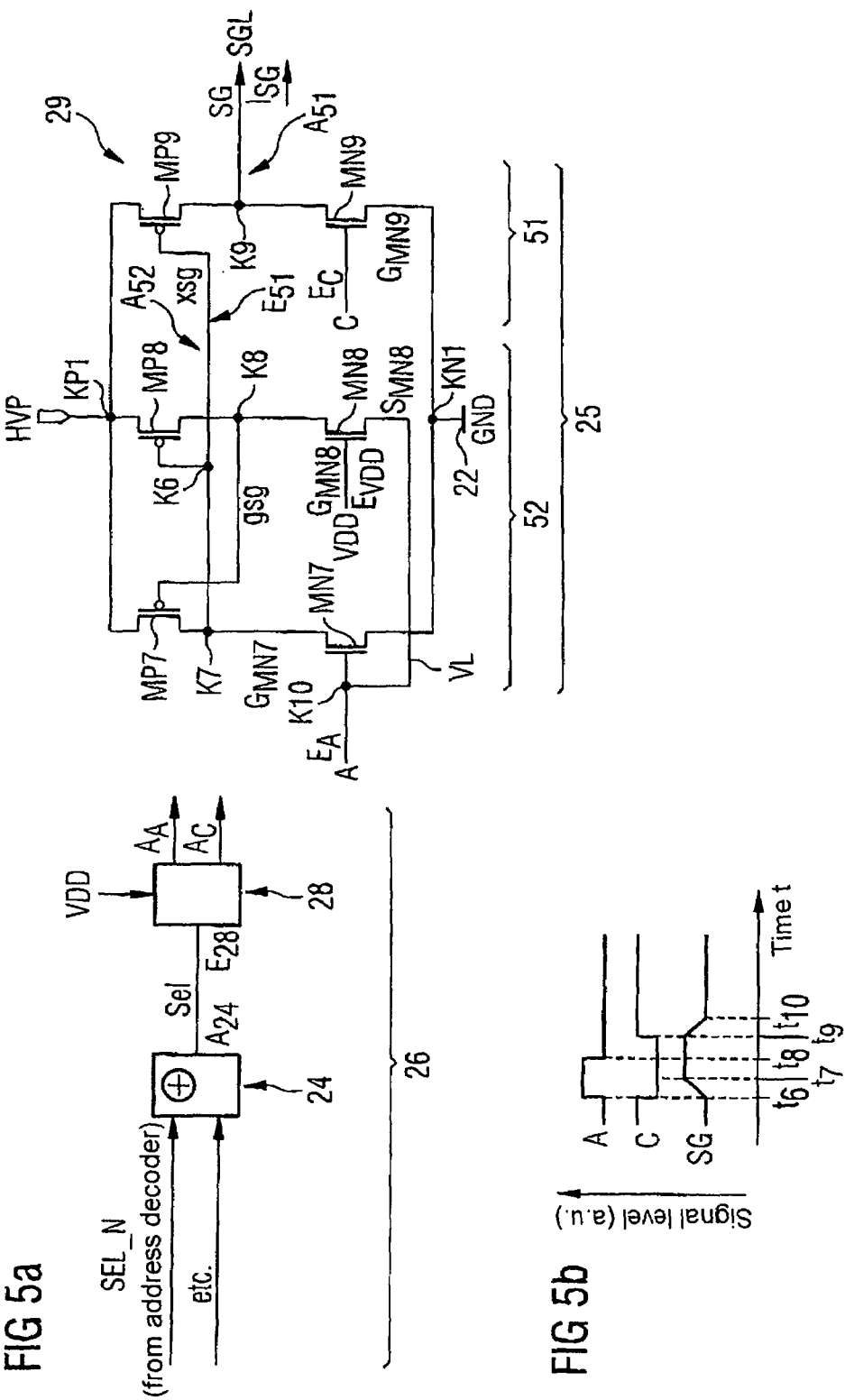

| | Selected | Not selected |
|---|---|---|
| Program/ Input program ($U_{th}$ small) | −8.4V +10V<br>0.0V ⸺ +6.6V | In the same word line<br>−8.4V +10.0V<br>0.0V ⸺ 0.0V<br><br>In the same bit line<br>+1.8V 0.0V<br>0.0V ⸺ +6.6V |
| Erase/ Erase ($U_{th}$ large) | +18.0V +1.8V<br>0.0V ⸺ 0.0V | 0.0V +1.8V |
| Read/Read | +1.8V +1.8V<br>1.2V ⸺ 0.0V | +1.8V 0V<br>1.2V ⸺ +0.0V |

CIRCUIT ARRANGEMENT AND METHOD FOR SWITCHING HIGH-VOLTAGE SIGNALS BY MEANS OF LOW-VOLTAGE SIGNALS

BACKGROUND

The invention relates to a circuit arrangement for switching high-voltage signals by means of low-voltage signals, particularly for driving a semiconductor memory arrangement and to a method for switching high-voltage signals by means of low-voltage signals, particularly for driving a semiconductor memory arrangement.

EEPROMs (Electrically Erasable Programmable Read Only Memories) or EAROMs (Electrically Alterable ROM), so-called flash memories, are known in various embodiments from the prior art. EEPROM/flash memories are generally divided into rows, so-called word lines, and columns, so-called bit lines, each intersection of bit lines and word lines representing one memory cell.

FIG. 7 shows a circuit diagram of a section from a cell array 1, comprising two word lines WLn, WLn−1, and two bit lines BLm, BLm+1' of an electrically erasable and then reprogrammable read only memory (EEPROM) according to the prior art.

Each intersection of a word line WLn, WLn−1 with a bit line $BL_m$, $BL_{m+1}$ comprises a memory cell 2 as shown, for example, in FIG. 8.

Each memory cell 2 comprises two transistors, namely a cell transistor 4 and a select transistor 3, the drain of the cell transistor 4 being connected to the source of the select transistor 3. Whereas the select transistor 3 is a conventional NMOS transistor of the enhancement type, the NMOS cell transistor has an electrically variable threshold voltage $U_{th}$. For this purpose, the cell transistor 4 comprises a so-called tunnel window 5 via which charges for changing the threshold voltage $U_{th}$ can be supplied to a floating gate $FG_4$ of the cell transistor 4.

Each word line $WL_n$, $WL_{n−1}$ comprises two control lines, namely a drive line $CGL_n$, $CGL_{n−1}$ for the so-called control gates $CG_4$ of the respective cell transistors 4 of a respective word line $WL_n$, $WL_{n−1}$, and a drive line $SGL_n$, $SGL_{n−1}$ for the so-called select gates $SG_3$ of a respective select transistor 3 of a respective word line $WL_n$, $WL_{n−1}$.

Each bit line $BL_m$, $BL_{m+1}$ likewise comprises two control lines, namely a drive line $S_m$, $S_{m+1}$ for the sources $S_4$ of the respective cell transistors 4 of a respective bit line $BL_m$, $BL_{m+1}$, and a drive line $D_m$, $D_{m+1}$ for the respective drains $D_3$ of the respective select transistors 3 of a respective bit line $BL_m$, $BL_{m+1}$.

Each memory cell can be selected by a suitable drive via the corresponding four associated drive lines. For example, the memory cell 2 in FIG. 7 can be driven via a corresponding circuit of the drive lines $CGL_n$, $SGL_n$ of the n-th word line $WL_n$ and the drive lines $S_{m+1}$, $D_{m+1}$ of the m+1-th bit line $BL_{m+1}$.

Each selected memory cell can be operated in three operating modes, namely the read mode, the erase mode and the program mode.

In the read mode, a memory cell is selected by applying a positive voltage of, for example, +1.8 volt to the select gate of the select transistor. The read mode results from the voltages applied to the source of the cell transistor, to the drain of the select transistor and to the control gate of the cell transistor of, in the exemplary embodiment, 1.2 volt, 0 volt and 1.8 volt.

In the erase mode, a memory cell is selected by applying a high positive voltage of in this case 18 volts to the control gate of the cell transistor.

Selection in the program mode occurs by applying 0 volt to the source of the cell transistor, −8.4 volts to the control gate of the cell transistor, +10 volts to the select gate of the select transistor and +6.6 volts to the drain of the select transistor. This circuit application simultaneously specifies the program mode.

All of the operating states can be seen in the table representation according to FIG. 9.

In FIG. 7, the voltage values in each case associated with the corresponding read mode (top), erase mode (in the center), program mode (bottom) are specified above the respective drive lines $CGL_n$, $SGL_n$, $SGL_{n−1}$, $CGL_{n−1}$, $S_m$, $D_m$, $S_{m+1}$, $D_{m+1}$. The values specified result in the memory cell identified by the reference symbol 2 being exclusively selected in all operating modes.

From the prior art, a multiplicity of circuit arrangements for driving the control gates of the cell transistors and the select gates of the select transistors with the voltages with relatively high values in the erase and program mode are known. A comparatively elaborate circuit arrangement is known, for example, from U.S. Pat. No. 5,265,052. A simpler circuit arrangement is described in the documents JP 06338197 A and DE 197 14 658 C2.

The drive to the select gates and control gates of the cell and select transistors, respectively, in a cell array with the aid of the circuit arrangements described in the two last-mentioned documents will firstly be described by means of drawing FIGS. 3 and 6.

FIG. 3 shows a circuit arrangement of a control gate driver 7 according to the prior art for driving the control gate $CG_4$ of a cell transistor 4 and a corresponding drive line CGL. The control gate driver 7 according to the prior art consists of a low-voltage logic with low-voltage transistors 16 and a high-voltage unit with high-voltage transistors 15. The low-voltage section with the low-voltage transistors 16 comprises a word line decoder 10 and a low-voltage read driver 9.

The high-voltage section with the high-voltage transistors 15 consists of a high-voltage decoupling transistor 8 and a high-voltage latch 6. The HV decoupling transistor 8, in this case an NMOS transistor, comprises a gate $G_8$, via which the high-voltage latch 6 can be separated from the low-voltage read driver 9. The high-voltage latch 6 consists of two series-connected inverters I1, I2, which in each case exhibit a PMOS transistor MP1, MP2 and an NMOS transistor MN1, MN2, the output of the second inverter I2, forming the output of the latch 6, being fed back to the input of the first inverter I1 via a feedback line RL. The source terminals of the respective transistors MP1, MP2 and, respectively, MN1, MN2, are in each case connected to one another via corresponding circuit nodes KP1 and KN1, respectively, and connected to a corresponding positive high-voltage supply HVP and negative high-voltage supply HVN, respectively.

Although the fundamental operation of the circuit arrangement is described in DE 197 14 658 C2, the operation of the control gate driver 7 will be explained by means of table 1 specified below.

TABLE 1

| | V(CON) | V(HVP) | V(HVN) | not selected | selected |
|---|---|---|---|---|---|
| Erase | vboost→0 V | vread→vpp | 0 V | 0 | 1 |
| Program | vboost→vprogn | vread→0 V | 0 V→vprogn | 1 | 0 |
| Read | vboost | vread | 0 V | 1 | 1 |

The Read Mode

The Read Mode is Initiated as Follows:

The voltage vboost is present at the terminal CON, the voltage vread is present at terminal HVP and the terminal HVN is at 0 volt. This state is retained for as long as it is intended to read from the cell.

Erase Mode

The Erase Mode is Initiated as Follows:

Before erasing, vboost is present at the terminal CON, vread is present at the terminal HVP and 0 volt is present at terminal HVN. The HV latch is brought into the desired state by the low-voltage logic 10 via the low-voltage driver 9. Then the connection from the HV latch 7 to the NV driver 9 is separated by lowering the voltage at the gate terminal CON to HVN=0 volt. After that, the voltage at the positive high-voltage supply HVP is ramped up to the erase voltage vpp. After the erase time has elapsed, the voltage at terminal HVP is lowered back to the read voltage vread and the connection to the NV driver 9 is restored by raising the voltage at the gate terminal CON to the boost voltage vboost.

Program Mode

The Program Mode is Initiated as Follows:

Before programming, the boost voltage vboost is present at terminal CON, the read voltage vread is present at the high-voltage supply terminal HVP and 0 volt is present at the high-voltage supply terminal HVN. The high-voltage latch (HV latch) 7 is brought into the desired state by the low-voltage logic 10 via the low-voltage driver 9. Then the connection from the HV latch 7 to the NV driver 9 is separated by dropping the voltage at the control terminal CON to HVN=initially 0 volt. After that, the voltages at the negative high-voltage terminal HVN and at the control terminal CON are ramped to the negative programming voltage vprogn. After the programming time has elapsed, the voltage at terminal HVN is increased again to 0 volt. After that, the connection to the NV driver 9 is restored by ramping up the voltage at the terminal CON to the boost voltage vboost.

As can be seen from the above explanations, the control gate word line CGL in a flash EEPROM is operated
a) with low voltage levels (e.g. 0 volt and 2 volts) in the read mode,
b) with high voltage levels (e.g. 0 volt and 18 volts) in the erase mode,
c) with high voltage levels (e.g. −12 volts and 0 volt) in the program mode, the low-voltage logic section 16 having to be separated from the high-voltage section 15 in the erase and program mode.

To separate the low-voltage section 16 from the high-voltage section 15 and to reconnect them, the high-voltage transistor 8 is required which is driven with the so-called boost voltage vboost. To provide this boost voltage vboost requires a charge pump. For this charge pump, an area must be provided on the semiconductor chip and, as well, an operating current for operating this charge pump and a control logic are required. To switch from the disconnected state to the read mode, the charge pump requires a certain time until it has reached its maximum output voltage. The flash EEPROM can only be read out after this time has elapsed.

Similar disadvantages occur if the operation of a so-called select gate driver 17 according to the prior art is considered as is shown, for example, in FIG. 6.

FIG. 6 shows a circuit arrangement of a select gate driver 17 according to the prior art for driving the select gate $SG_4$ of a cell transistor 4 and a corresponding drive line SGL. The select gate driver 17 according to the prior art consists of a low-voltage logic with low-voltage transistors 26, and a high-voltage unit with high-voltage transistors 25. The low-voltage section with the low-voltage transistors 26 comprises a word line decoder 20 and a low-voltage read driver 19.

The high-voltage section with the high-voltage transistors 25 consists of a high-voltage decoupling transistor 18 and a high-voltage latch 21. The HV decoupling transistor 18, again an NMOS transistor, comprises a gate $G_{18}$ via which the high-voltage latch 21 can be separated from the low-voltage read driver 19. The high-voltage latch 21 consists of two series-connected inverters I1, I2, in each case exhibiting a PMOS transistor MP1, MP2, and an NMOS transistor MN1, MN2, the output of the second inverter I2 forming the output of the latch 21 being fed back to the input of the first inverter I1 via a feedback line RL. The source terminals of the respective transistors MP1, MP2 and, respectively, MN1, MN2 are in each case connected to one another via corresponding circuit nodes KP1 and KN1, respectively, and are connected to a corresponding positive high-voltage supply HVP and ground GND (terminal 22).

Although the fundamental operation of the circuit arrangement is described in DE 197 14 658 C2, the operation of the select gate driver 17 will be explained here, too, by means of the table 2 specified below.

TABLE 2

| | | | Logic level at sgi⇒ voltage at SGL | |
|---|---|---|---|---|
| | V(CON) | V(HVP) | not selected | selected |
| Erase | vboost | vread | 1 ⇒vdd | 1 ⇒vdd |
| Program | vboost → 0 V | vread → vpp | 0 ⇒0 V | 1 ⇒vpp |
| Read | vboost | vread | 0 ⇒0 V | 1 ⇒vdd |

The Read Mode

The Read Mode is Initiated as Follows:

At terminal CON, the voltage vboost is present and at terminal HVP the read voltage vread is present. As long as no reading takes place, 0 volt are present at sgi and SGL. If it is intended to read from the relevant word line, the voltage at sgi is raised to the read voltage VRead for a short time by the NV driver and then lowered again to 0 volt. Via the low-resistance connecting transistor 18, the voltage at SGL follows the voltage at sgi.

Erase Mode

The Erase Mode is Initiated as Follows:

At terminal CON, the voltage vboost is present and at terminal HVP the voltage vread is present. The logic level is 1 and thus vread is also present at SGL. This state is retained as long as erasing is taking place.

Program Mode

The program mode is initiated as Follows:

Before programming, the boost voltage vboost is present at terminal CON and the read voltage vread is present at terminal HVP. The HV latch 17 is brought into the desired state by the low-voltage logic 20 via the low-voltage driver 19. Then the connection from the HV latch 17 to the NV driver 19 is separated by lowering the voltage at CON to 0 volt. After that, the voltage at HVP is ramped to the voltage vboost. After the programming time has elapsed, the voltage at HVP is dropped again to 0 volt. After that, the connection to the NV driver 19 is restored by ramping up the voltage at CON to vboost.

As can be seen from the above, the driving of a select gate word line SGL in an EEPROM is characterized by the fact that it is operated a) very rapidly with low voltage levels (e.g. 0 volt and 2 volts) in a read mode, and
b) with high voltage levels (e.g. 0 volt and 10 volts) in a program mode, the low-voltage logic section 26 having to be separated from the high-voltage section 25 in the program mode.

If a high-voltage transistor 18 is used for separating the low-voltage logic and the read amplifier from the high-voltage latch 21, a so-called boost voltage vboost is again needed. To generate this voltage, a separate charge pump is again necessary.

SUMMARY

The object of the invention is then seen in providing a circuit arrangement and a method for switching high-voltage signals by means of low-voltage signals, which manages with fewer charge pumps and in which the switching times are reduced compared with the circuit arrangements described above. In particular, a circuit arrangement for driving a cell array is to be provided which, instead of five charge pumps as are needed in the solution described above according to the prior art, now requires only three charge pumps.

According to the invention, the necessity of the boost voltage is circumvented by the high-voltage transistors of latch and potential shifting circuit, which are required for providing a high voltage at a respective control gate line and select gate line, respectively, of a word line, only being driven via their gates by the low-voltage logic and there not being any connections to the lines possibly carrying high voltage.

BRIEF DESCRIPTION OF THE DRAWINGS

The invention will now be described in greater detail with reference to the drawing, in which:

FIG. 1 shows a circuit arrangement of a first exemplary embodiment of a control gate driver according to the invention for driving the control gate of a cell transistor of an electrically erasable and then reprogrammable read only memory (EEPROM), FIG. 2 shows a circuit arrangement of a second exemplary embodiment of a control gate driver according to the invention for driving the control gate of a cell transistor of an electrically erasable and then reprogrammable read only memory (EEPROM), FIG. 5 shows a) a circuit arrangement of a second exemplary embodiment of a select gate driver according to the invention for driving the select gate of a select transistor of an electrically erasable and then reprogrammable read only memory (EEPROM), b) low-voltage signals for driving the circuit arrangement according to FIG. 5a) in the read mode.

DESCRIPTION

Figure 3:
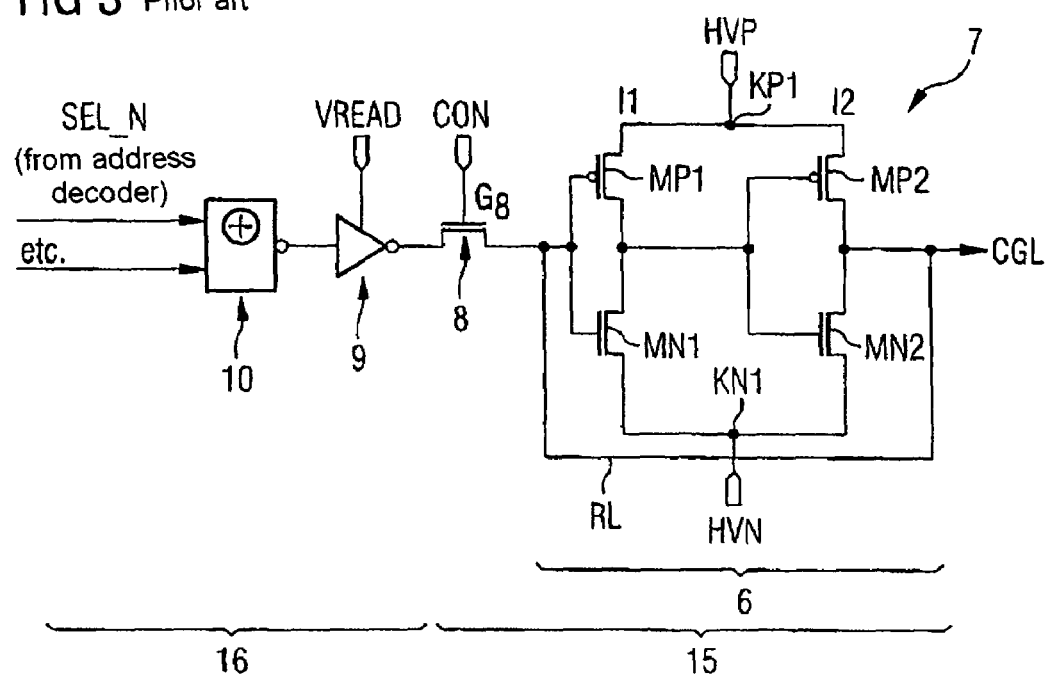
FIG. 3 shows a circuit arrangement of an exemplary embodiment of a control gate driver according to the prior art for driving the control gate of a cell transistor of an electrically erasable and then reprogrammable read only memory (EEPROM)

In the figures, identical reference symbols designate identical or functionally identical components.

FIG. 1 shows a circuit arrangement of a first exemplary embodiment of a control gate driver 11 according to the invention for driving the control gate CG4 of a cell transistor 4 of an EEPROM.

The control gate driver 11 comprises a high-voltage section with high-voltage transistors 15 and a low-voltage section with low-voltage transistors 16. Functionally, the control gate driver 11 comprises a word line decoder 12 and a latch 49 with a level shifter (not explicitly shown). The latch 49 comprises four high-voltage transistors, namely two PMOS transistors MP3, MP4 and two NMOS transistors MN3, MN4 and an inverter 13.

The two source terminals of the two PMOS transistors MP3, MP4 are connected to a positive high-voltage supply HVP via a node KP2. The two source terminals of the NMOS transistors MN3, MN4 are connected to a negative high-voltage supply HVN via a node KN2. The two drain terminals of the two transistors MP3 and MN3 are connected to the gate of the NMOS transistor MN4 via a node K3. The two drain terminals of the two transistors MP4, MN4 are connected to the gate of the NMOS transistor MN3 via a node K4. Furthermore, node K4 is connected to the output $A_{49}$ of the latch 49 which forms the connection to the control gate line CGL of the word line. The input $E_{49}$ of the latch 49 is connected to a node KSel which, in turn, is connected to an input $E_{13}$ of the inverter 13 and to the gate $G_{MP3}$ of the PMOS transistor MP3. The output $A_{13}$ of the inverter 13 is connected to the gate $G_{MP4}$ of the PMOS transistor MP4.

The input $E_{49}$ of the latch 49 is connected to the output $A_{12}$ of the word line decoder 12. This word line decoder 12 exhibits a multiplicity of inputs SEL_N etc. connected to an address decoder.

The operation of the control gate driver 11 according to FIG. 1 will now be explained with reference to the operating cases enumerated in the text which follows.

Read Mode

The read mode is initiated in that the read voltage vread is applied to the terminal HVP and the voltage 0 V is applied to the terminal HVN. The logic level is "1", thus CGL is at the read voltage vread. During the read mode, no charge pump is active.

Erase Mode

HVP is at vread is 0 volt.

Figure 12:
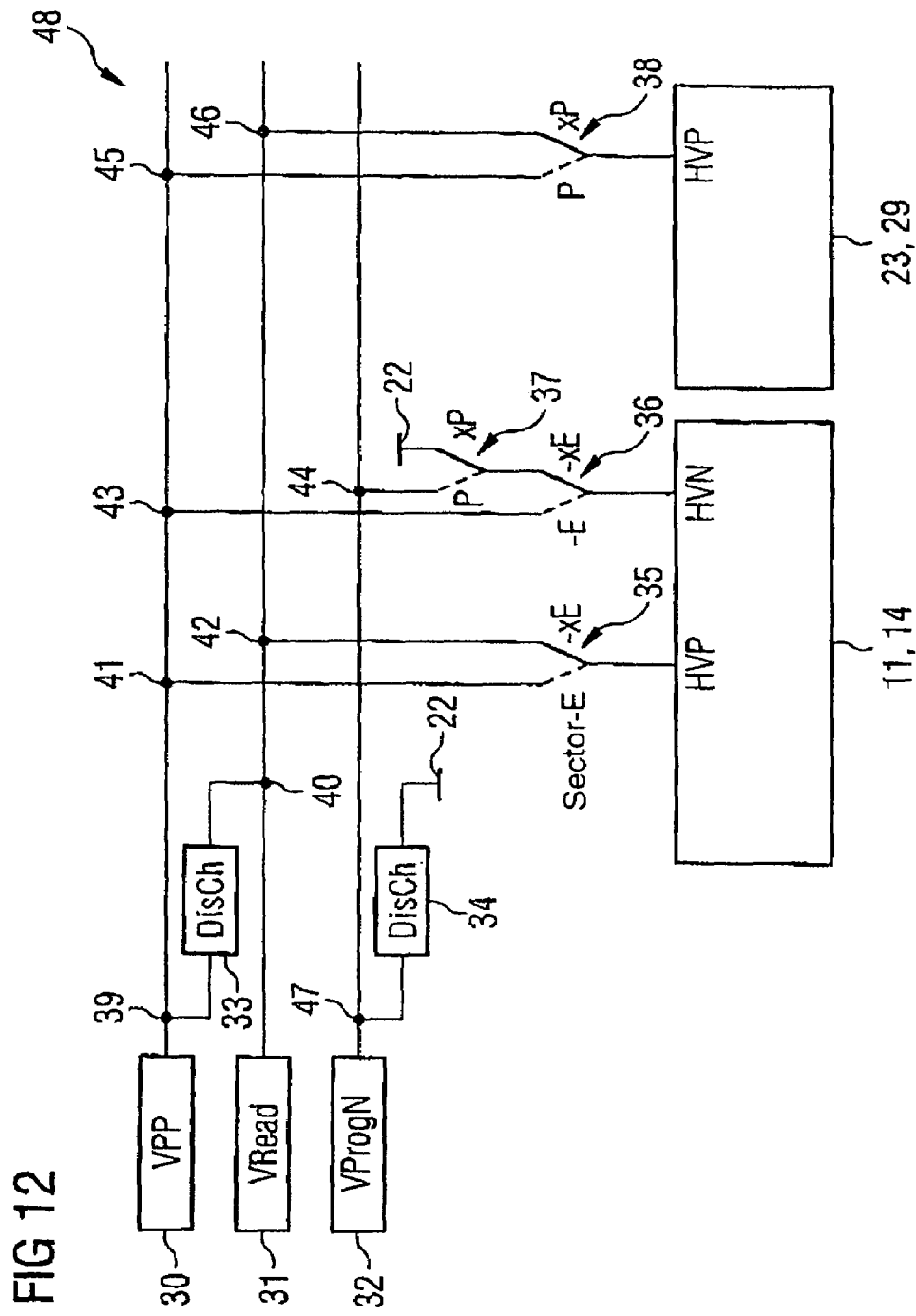
FIG. 12 shows a drive circuit for the control gate drivers according to FIGS. 1 and 2 and the select gate drivers according to FIGS. 4 and 5.

The erase mode is initiated in that the voltages at terminal HVP and at terminal HVN are simultaneously ramped up to the erase voltage HVP at the word lines selected (by the position E of the sector erase select switches 35 and 36, compare FIG. 12 and the associated subsequent description). After the end of the erase time, the voltage at terminal HVP is dropped again to the read voltage vread (The sector erase select switches 35 and 36 are switched to the position xE, compare FIG. 12 and its associated description of figures) and the voltage at terminal HVN is dropped to 0 volt. By this means, all memory cells of the relevant word lines are erased.

Program Mode

The high voltage terminal HVP is at the read voltage VRead, the high-voltage terminal HVN is at 0 volt. Word line CGL selected: select signal Sel=logic "0", word line CGL not selected: select signal SEL=logic "1".

The program mode is initiated in that the voltage at HVN is ramped to the negative programming voltage vpn. If word line CGL was selected (select signal Sel at logic "0"), the signal CG at the word line CGL follows the voltage at HVN. If word line CGL was not selected (select signal Sel at logic "1"), the signal CG at the word line CGL remains at the voltage at HVP. After the programming time has elapsed, the voltage at HVN is raised again to 0 volt.

As can be seen from the above, no boost voltage vboost is required for separating or reconnecting the low-voltage logic to the high-voltage latch.

In the erase mode, the sector to be erased is selected by the positive high voltage at terminal HVP. In the program mode, the word line to be programmed is selected with the aid of the word line decoder of the low-voltage logic.

FIG. 2 shows a circuit arrangement of a second exemplary embodiment of a control gate driver 14 according to the invention for driving the control gate $CG_4$ of a cell transistor 4 of an EEPROM.

The control gate driver 14 comprises a high-voltage section with high-voltage transistors 15 and a low-voltage section with low-voltage transistors 16. Functionally, the control gate driver-14 comprises a word line decoder 12 and a latch 53 with level shifter, not shown explicitly. The latch 53 comprises six high-voltage transistors, namely two PMOS transistors MP3, MP4 and four NMOS transistors MN3, MN4, MN5 and MN6 and an inverter 13.

The two source terminals of the two PMOS transistors MP3, MP4 are connected to a positive high-voltage supply HVP via a node KP2. The two source terminals of the NMOS transistors MN3, MN4 are connected to a negative high-voltage supply HVN via a node KN2. The drain terminal of the transistor MN3 is connected to the source terminal of the transistor MN5. The drain terminal of the transistor MN4 is connected to the source terminal of the transistor MN6. The two drain terminals of the two transistors MP3 and MN5 are connected to the gate of the NMOS transistor MN4 via a node K3. The two drain terminals of the two transistors MP4, MN6 are connected to the gate of the NMOS transistor MN3 via a node K4. Furthermore, the node K4 is connected to the output $A_{53}$ of the latch 53 which forms the connection to the control gate line CGL of the word line. The input $E_{53}$ of the latch 53 is connected to a node KSel which, in turn, is connected to an input $E_{13}$ of the inverter 13 and to the gate $G_{MP3}$ of the PMOS transistor MP3 and, via a node K11, to the gate $G_{MN5}$ of the NMOS transistor MN5. The output $A_{13}$ of the inverter 13 is connected to the gate $G_{MP4}$ of the PMOS transistor MP4 and to the gate $G_{MN6}$ of the NMOS transistor MN6 via a node K5.

The input $E_{53}$ of the latch 53 is connected to the output $A_{12}$ of the word line decoder 12. This word line decoder 12 exhibits a multiplicity of inputs SEL_N etc. connected to an address decoder.

The operation of the control gate driver 14 according to FIG. 1 will now be explained with reference to the operating cases enumerated in the text which follows.

The Read Mode

The read mode is initiated in that the voltage vread is applied to the terminal HVP and the voltage 0 volt is applied to the terminal HVN. The logic level is "1", therefore the read voltage vread is present at the word line CGL. During the read mode, no charge pump is active.

Erase Mode

HVP is at the read, HVN is at 0 volt

The erase mode is initiated in that (at the word lines selected by the position E of the sector erase select switches 35 and 36) the voltages at HVP and at HVN are simultaneously ramped up to the erase voltage vpp. After the end of the erase time, the voltage at HVP is dropped again to the read voltage vread, the sector erase select switches 35 and 36 are switched to the position xE (compare FIG. 12) and the voltage at HVN thus goes to 0 volt. By this means, all memory cells of the relevant word lines are erased.

Program Mode

At the terminal HVP, the read voltage vread is present, HVN is at 0 volt.

Word line selected: select signal Sel="0"

Word line not selected: select signal Sel="1"

The program mode is initiated in that the voltage at terminal HVN is ramped to the negative programming voltage vprogn. If the word line has been selected, the voltage at CGL follows the voltage at HVN. If the word line was not selected, the voltage at CGL remains at the voltage at HVP. After the programming time has elapsed, the voltage at HVN is raised again to 0 volt.

Figure 4A:
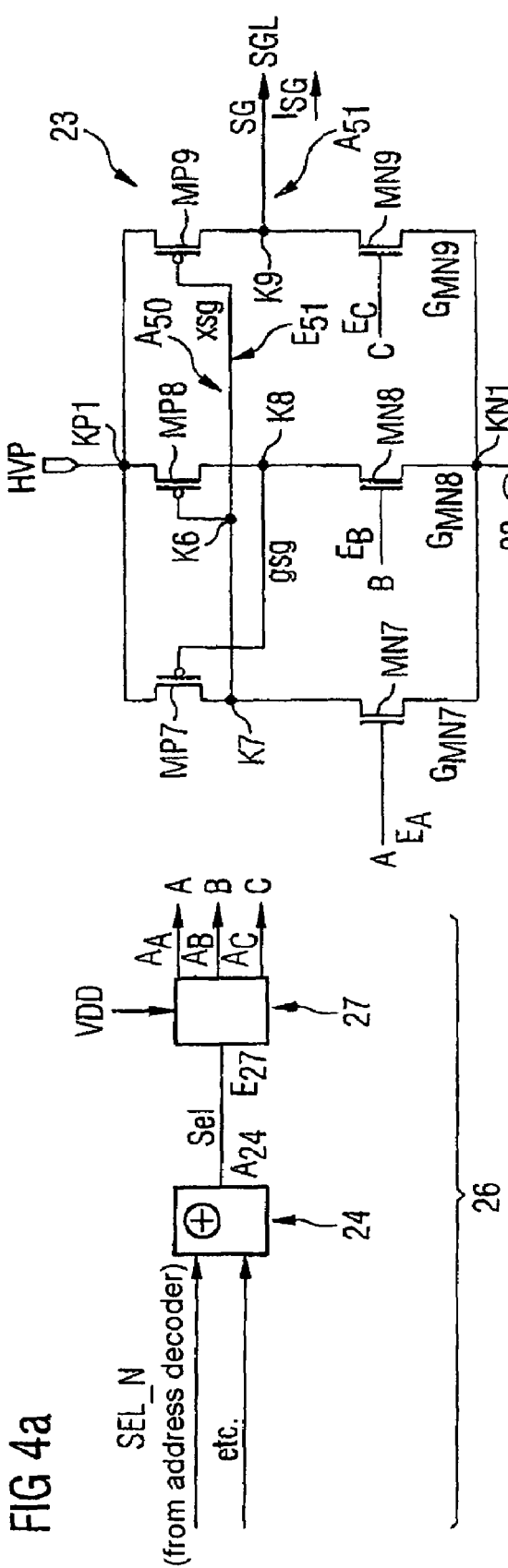
FIG. 4 shows a) a circuit arrangement of a first exemplary embodiment of a select gate driver according to the invention for driving the select gate of a select transistor of an electrically erasable and then reprogrammable read only memory (EEPROM), b) low-voltage signals for driving the circuit arrangement according to FIG. 4a) in the read mode.

FIG. 4a) shows a circuit arrangement of a first exemplary embodiment of a select gate driver 23 according to the invention for driving the select gate $SG_3$ of a select transistor 3 of an EEPROM.

The select gate driver 23 comprises a low-voltage section with low-voltage transistors 26 and a high-voltage section with high-voltage transistors 25. The low-voltage section with low-voltage transistors 26 comprises a word line decoder 24 and a drive device 27. As in the previous exemplary embodiments, the word line decoder 24 comprises a multiplicity of inputs SEL_N which are connected to an address decoder. An output $A_{24}$ of the word line decoder 24 is connected to an input $E_{27}$ of the drive device 27. This drive device 27 exhibits three outputs $A_A$, $A_S$ and $A_c$ which are connected to corresponding inputs $E_A$, $E_B$, $E_C$ of the high-voltage section exhibiting high-voltage transistors 25, in the manner described in the text which follows.

The high-voltage section with the high-voltage transistors 25 comprises a latch 50 and a level shifter 51.

The latch 50 comprises four transistors, namely a PMOS transistor MP7, a PMOS transistor MP8, an NMOS transistor MN7 and an NMOS transistor MN8.

The source terminals of the two NMOS transistors MN7, MN8 are connected to a node KN1 which is connected to ground 22 (GND). The two source terminals of the PMOS transistors MP7, MP8 are connected to a node KP1 which is connected to a high-voltage supply HVP.

The two drain terminals of the two transistors MP7 and MN7 are connected to a node K7 which, in turn, is connected to a node K6. The node K6 is connected to the gate of the PMOS transistor MP8. Furthermore, the node K6 is connected to an output $A_{50}$ of the latch 50.

The two drain terminals of the two transistors MP8, MN8 are connected to a node K8. The node K8 is connected to a gate of the PMOS transistor MP7.

The respective gate terminals $G_{MN7}$ and $G_{MN8}$ of the NMOS transistors MN7, MN8 are connected to corresponding inputs $E_A$ and $E_B$, respectively.

The level shifter 51 comprises two high-voltage transistors, namely a PMOS transistor MP9 and an NMOS transistor MN9. The source terminal of the PMOS transistor MP9 is connected to the node KP1. The gate of the PMOS transistor MP9 is connected to an input $E_{51}$ of the level shifter 51 which, in turn, is connected to the output $A_{50}$ of the latch 50.

The source terminal of the NMOS transistor MN9 is connected to the node KN1. The gate terminal $G_{MN9}$ is connected to the aforementioned input $E_C$ of the level shifter 51.

The two drain terminals of the two transistors MN9 and MP9 are connected to one another via a node K9. This node K9 is connected to an output $A_{51}$ of the level shifter 51. This output $A_{51}$ of the level shifter 51 is connected to the select gate line SGL of the word line.

The aforementioned outputs $A_A$, $A_B$, $A_C$ of the drive device 27 are connected to the inputs $E_A$, $E_B$, $E_C$, connected to the gates $G_{MN7}$, $G_{MN8}$, $G_{MN9}$, of the latch 50 and of the level shifter 51, respectively.

The operation of the select gate driver circuit arrangement 23 will now be described with reference to the operating cases enumerated in the text which follows.

The Read Mode

Figure 4B:
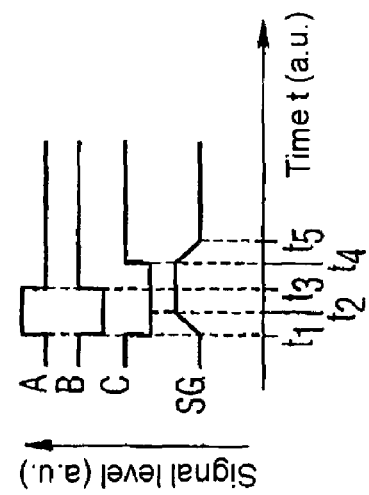
Figure 6:
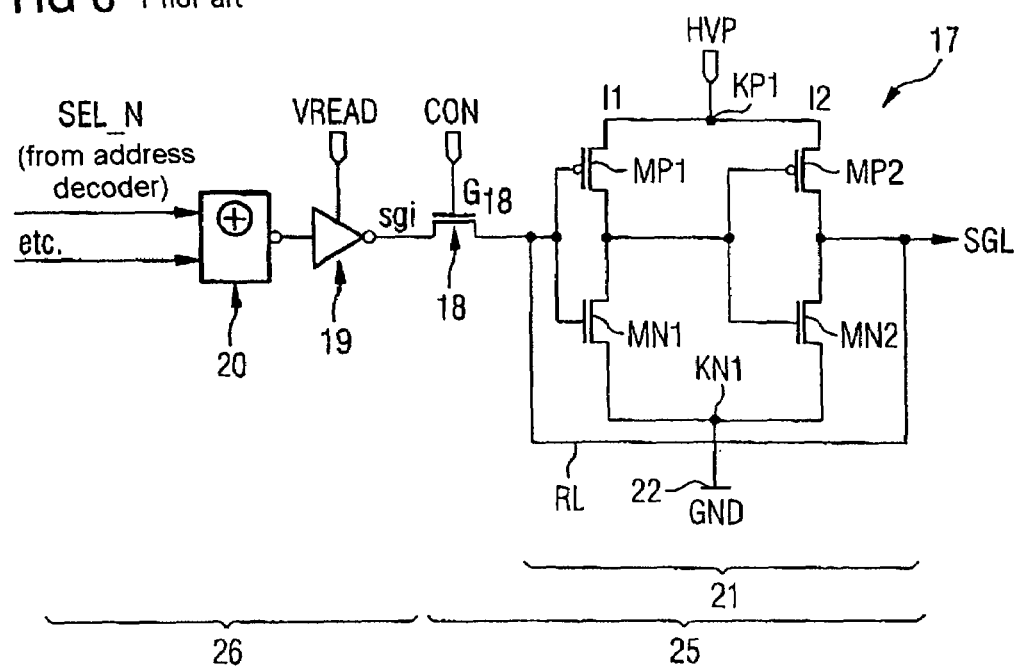
FIG. 6 shows a circuit arrangement of an exemplary embodiment of a select gate driver according to the prior art for driving the select gate of a select transistor of an electrically erasable and then reprogrammable read only memory (EEPROM)
Figure 7:
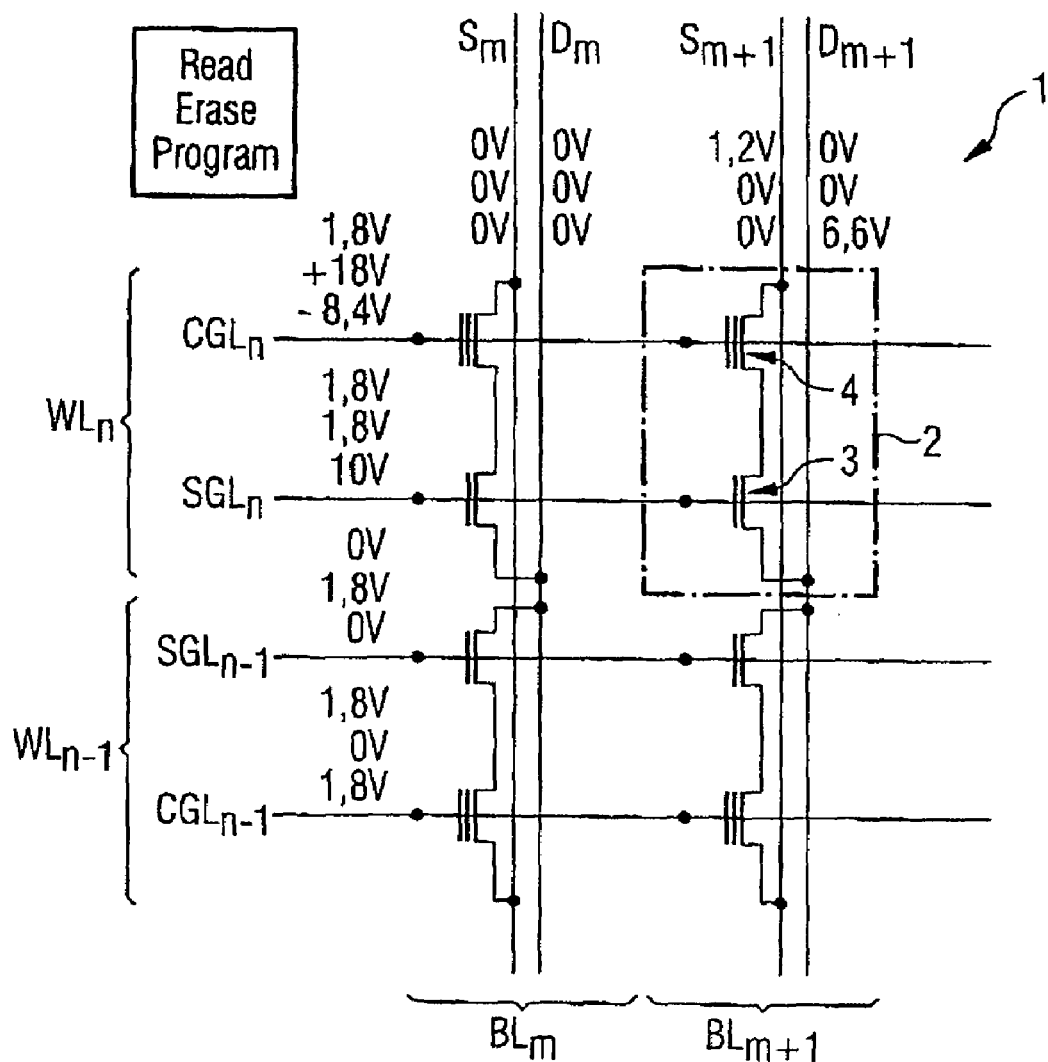
FIG. 7 shows a circuit diagram of a section, comprising two word lines and two bit lines, of a cell array of an electrically erasable and then reprogrammable read only memory (EEPROM) according to the prior art with drive voltages typical of different operating modes and with a selected memory cell.
Figures 8, 9:
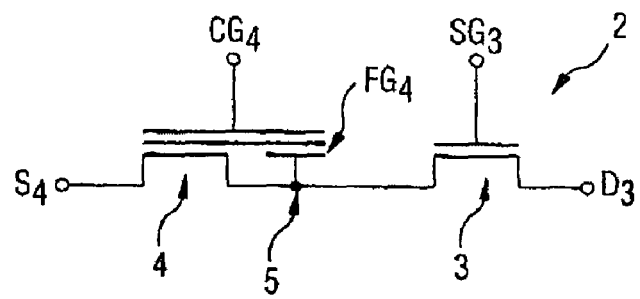
FIG. 8 shows a circuit diagram of a memory cell according to the prior art with a select transistor and a cell transistor for a cell array according to FIG. 7.
FIG. 9 shows a table representation of voltages present at the select transistor and the cell transistor of the memory cell according to FIG. 8 under different operating states.

The read mode is initiated by applying the voltage vread to the terminal HVP. As long as the relevant word line is not read, the logic level is equal to "0", and the voltage SG at the drive line SGL is thus at 0 V. If it is intended to read from the relevant word line, a signal sequence is applied by the logic 27 to A, B and C as can be seen in principle from FIG. 4b). Thus, the HV driver generates the desired variation of the signal with time at the drive line SGL (see FIG. 10 for a detailed representation). During the read mode, no charge pump is active. An accurate explanation of the operation can be found in the description following, referring to FIG. 10.

Erase Mode

The read voltage vread is present at terminal HVP.

This state is not changed in the erase mode.

Program Mode

The read voltage vread is present at terminal HVP.

Word line selected: Sel="1", A="1", B="0", C="0"

Word line not selected: Sel="0", A="0", B="1", C="1".

The program mode is initiated in that HVP is ramped up to vboost from vread. If the word line was selected, SGL follows the HVP. If the word line was not selected, SGL remains at 0 V. After the programming time has elapsed, the voltage at terminal HVP is discharged again to the read voltage vread.

FIG. 5 shows a circuit arrangement of a second exemplary embodiment of a select gate driver 29 according to the invention for driving the select gate $SG_3$ of a select transistor 3 of an EEPROM.

The select gate driver 29 comprises a low-voltage section with low-voltage transistors 26 and a high-voltage section with high-voltage transistors 25. The low-voltage section with low-voltage transistors 26 comprises a word line decoder 24 and a drive device 28. As in the previous exemplary embodiments, the word line decoder 24 comprises a multiplicity of inputs SEL_N which are connected to an address decoder, not shown. An output $A_{24}$ of the word line decoder 24 is connected to an input $E_{28}$ of the drive device 28. This drive device 28 exhibits two outputs $A_A$ and $A_C$ which are connected to corresponding inputs $E_A$, $E_C$ of the high-voltage section exhibiting high-voltage transistors 25, in the manner described in the text which follows.

The high-voltage section with the high-voltage transistors 25 comprises a latch 52 and a level shifter 51.

As in the exemplary embodiment described above, the latch 52 comprises four transistors, namely a PMOS transistor MP7, a PMOS transistor MP8, an NMOS transistor MN7 and an NMOS transistor MN8.

The source terminal of the NMOS transistor MN7 is connected to a node KN1 which is connected to ground 22 (GND). The two source terminals of the PMOS transistors MP7, MP8 are connected to a node KP1 which is connected to a high-voltage supply HVP.

The two drain terminals of the two transistors MP7 and MN7 are connected to a node K7 which, in turn, is connected to a node K6. The node K6 is connected to the gate of the PMOS transistor MP8. Furthermore, the node K6 is connected to an output $A_{52}$ of the latch 52.

The two drain terminals of the two transistors MP8, MN8 are connected to a node K8. The node K8 is connected to a gate of the PMOS transistor MP7.

The gate terminal $G_{MN7}$ of the NMOS transistor MN7 and the source terminal of the NMOS transistor MN8 are connected to the aforementioned input $E_A$. The gate terminal $G_{MN8}$ of the NMOS transistor MN8 is connected to a supply voltage vdd.

The level shifter 51 comprises two high-voltage transistors, namely a PMOS transistor MP9 and an NMOS transistor MN9. The source terminal of the PMOS transistor MP9 is connected to the node KP1. The gate of the PMOS transistor MP9 is connected to an input $E_{51}$ of the level shifter 51 which, in turn, is connected to the output $A_{52}$ of the latch 52.

The source terminal of the NMOS transistor MN9 is connected to the node KN1. The gate terminal $G_{MN9}$ is connected to an input $E_C$ of the level shifter 51.

The two drain terminals of the two transistors MN9 and MP9 are connected to one another via a node K9. This node K9 is connected to an output $A_{51}$ of the level shifter 51. This output $A_{51}$ of the level shifter 51 is connected to the select gate line SGL of the word line.

The aforementioned outputs $A_A$, $A_C$ of the drive device 28 are connected to the input $E_A$, connected to the gate $G_{MN7}$, of the latch 52 with the input $E_C$, connected to the gate $G_{MN9}$ and to the level shifter 51, respectively.

The operation of the select gate driver circuit arrangement 29 will now be described by means of the operating cases enumerated in the text which follows.

The Read Mode

The read mode is initiated in that the voltage vread is applied to the terminal HVP. As long as the relevant word line is not read, the logic level is equal to 0, thus SGL is at 0 V. If it is intended to read from the relevant word line, the logic 28 applies a signal sequence to A and C as can be seen in principle from FIG. 5b). As a result, the HV driver generates the required variation with time at the drive line SGL (see FIG. 10 for a detailed representation). During the read mode, no charge pump is active. An accurate explanation of the operation can be found in the following comparison of the signal variations in a select gate driver 23 according to FIG. 4 and a select gate driver 29 according to FIG. 5, referring to FIG. 10.

Erase Mode

HVP is at vread.

This state is not change in the erase mode.

Program Mode

HVP is at vread.

Word line selected: Sel="1", A="1", B="0", C="0"

Word line not selected: Sel="0", A="0", B="1", C="1"

The program mode is initiated in that HVP is ramped up to vboost from vread. If the word line was selected, the voltage SG at the drive line SGL follows the voltage at terminal HVP. If the word line was not selected, the signal SG at the drive line SGL remains at 0 V. After the programming time has elapsed, the voltage at HVP is discharged again to the read voltage vread.

Figure 10:
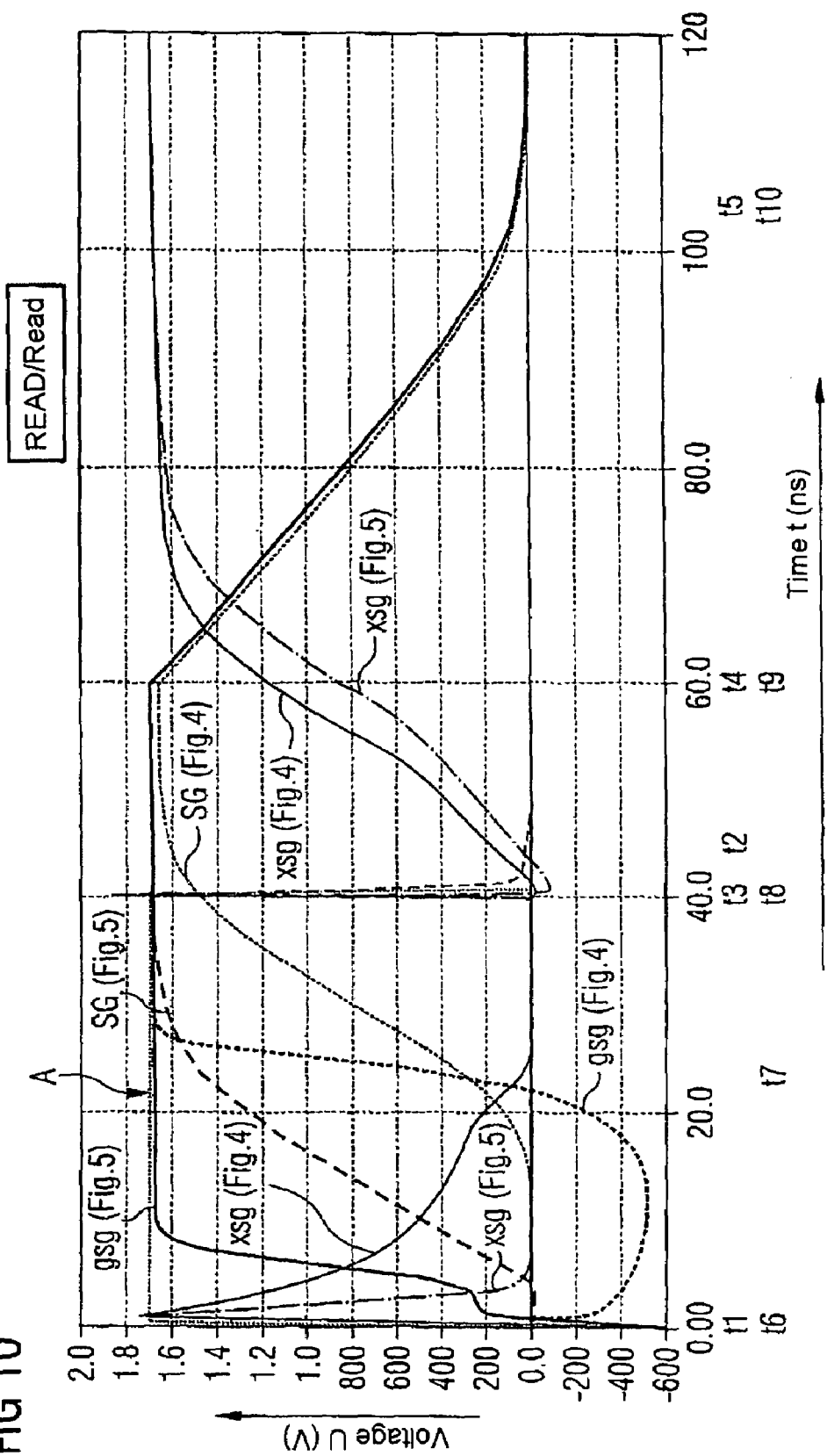
FIG. 10 shows voltage variations with time of signals in the select gate drivers according to FIGS. 4 and 5, particularly low-voltage input signals at an input of a high-voltage latch, internal signals in the high-voltage latch, output signals at an output of the high-voltage latch and output signals of a potential shifting circuit and drive signals of the select gate of a select transistor according to FIG. 8.
Figure 11:
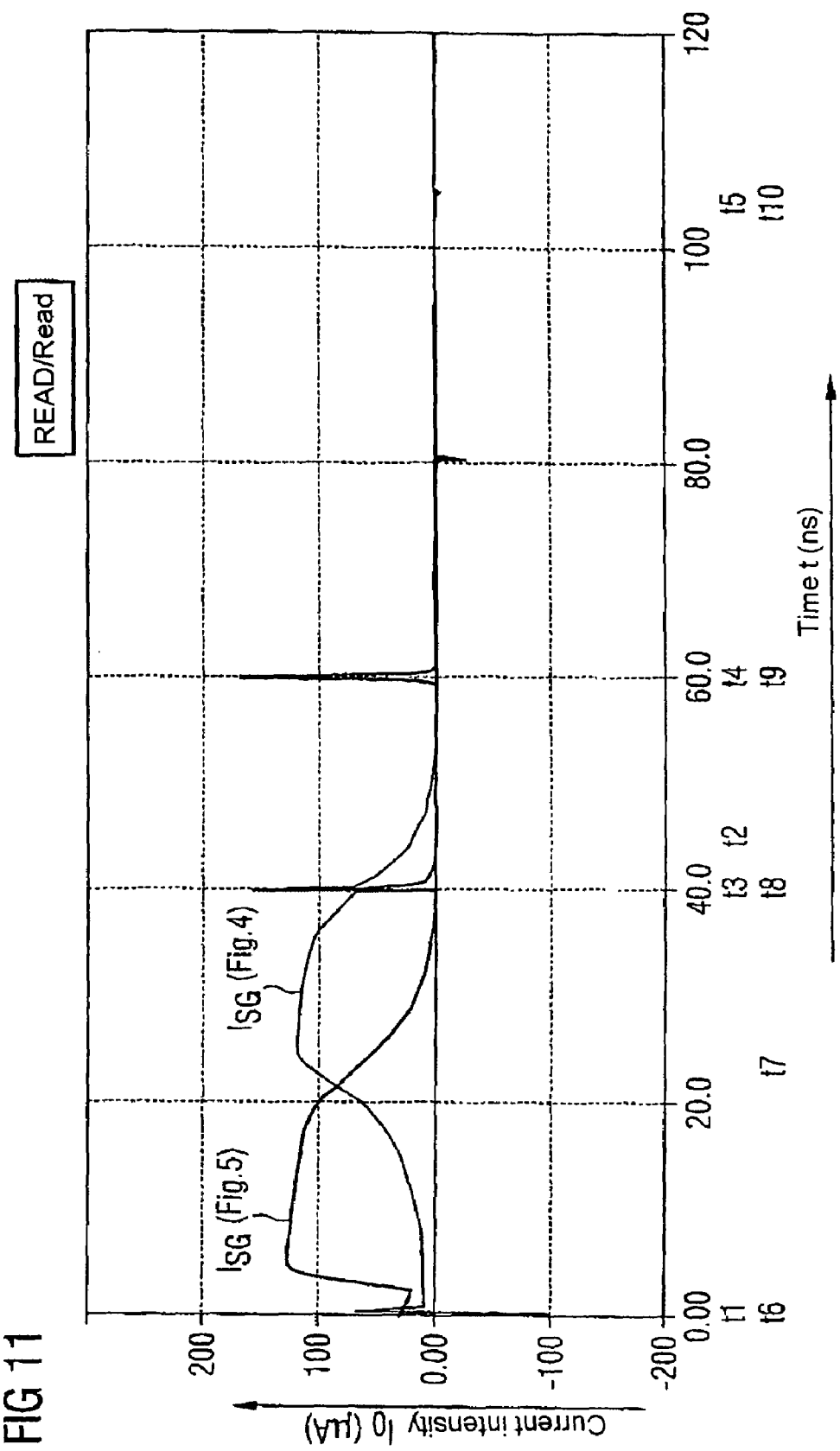
FIG. 11 shows current variations with time of the output signals of the select gate drivers according to FIGS. 4 and 5.

FIG. 10 shows a comparison of characteristic voltage signals in the select gate drivers 11, 14 according to FIGS. 4 and 5. Correspondingly, FIG. 11 shows a comparison of the output currents of the output signals of the selected drivers 23, 29 according to FIGS. 4 and 5 in the read mode.

It is assumed that the input $E_A$ is supplied with a signal A which rises from a voltage U=0 volt to a voltage U=1.6 volt within one nanosecond at a first time $t_1$, $t_6$; it remains at this level for 40 nanoseconds and drops from the voltage U=1.6 volt to a value of U=0 volt within one nanosecond at a second time $t_3$=$t_8$=40 nanoseconds.

The signal 8, corresponding to the circuit arrangement according to FIG. 4 which is not shown in the drawing in FIG. 10, exhibits precisely the inverse variation. Starting from a voltage U=1.7 volt at time $t_1$=0 volt, the voltage of signal B drops to U=0 volt within one nanosecond and remains at this value for 40 ns up to time $t_3$=40 ns. At this time $t_3$=40 ns, the voltage U of the signal. B rises from 0 volt to U=1.7 volt and remains at this value.

Similarly, the signal variation of the signal C is selected in both exemplary embodiments in such a manner that it drops from a voltage value U=1.7 volt at time $t_1$=$t_6$=0 volt to the value U=0 volt within one nanosecond. The signal C remains at this value up to a time $t_4$=$t_9$=60 nanoseconds and then rises again to the value U=1.7 volt within one nanosecond.

On the basis of these signal variations A, C and possibly B, predetermined by the respective drive device 28, a switching behavior of the type described in the text which follows is obtained:

Select Gate Driver 23:

Before the read process, the voltage SG at drive line SGL is at 0 volt, the signal A is at voltage vdd, the signals B and C are at 0 volt.

At the beginning of the read process, the signal A goes from 0 V to the voltage vdd, the signals B and C go from the voltage vdd to 0 volt. With the signal C, the transistor MN9 is switched from conducting to blocking. In the circuit arrangement according to FIG. 4, the signal gsg at node K8 drops below 0 volt with the falling edge of the control signal B which is coupled into the signal gsg via the gate-drain capacitance of the transistor MN8. As a result, the gate-source voltage of transistor MP7 becomes larger and the latter thus obtains a greater conductivity between drain and source. The gate-source voltage at transistor MN7, the signal A, is set to the voltage vdd. The transistor MN7 has the task of pulling the voltage xsg at terminal HVP to 0 V. In contrast, the transistor MP7, which has become stronger, wants to keep the voltage of the signal xsg at the level of the terminal HVP and thus delays the discharging of the signal xsg. It is only when the signal xsg is low enough, that, on the one hand, the signal gsg is pulled from the transistor MP8 to the voltage level at terminal HVP and the HV latch 50 is flipped into the "1" state and, on the other hand, the signal SG is charged up to the voltage at terminal HVP via the transistor MP9. The charging itself occurs without shunt current via the transistor MN9 since the latter has been switched off at the beginning of the procedure.

Ending the read process: The HV latch 50 is brought from the "1" state into the "0" state by the change of polarity of the signals A and B: the signal gsg is discharged to 0 V by the transistor MN8 which in this case exhibits a greater conductivity than the transistor MP8. As a result, the transistor MP7 becomes conducting, the voltage of the signal xsg is pulled to the level at the terminal HVP by the transistor MP7 and the transistor MP9 is cut off. After that, the transistor MN9 is switched to conduct by a high level of the signal C and discharges the drive line SGL to 0 V without a shunt current flowing through the transistor MP9.

Select Gate Driver 29

Before the read process, the control signal SG is at 0 volt, the signal A is at the voltage vdd, the signals B, C are at 0 volt.

At the beginning of the read process, the voltage of the signal A of 0 V goes to the voltage vdd, the voltage of the signal C goes from the voltage VDD to 0 V. The transistor MN9 is switched from conducting to blocking with the aid of the signal C. In the circuit arrangement according to FIG. 5, the signal gsg at node K8 rises with the rising edge of the control signal A which is coupled into the signal gsg via the source-drain capacitance of the transistor MN8. As a result, the gate-source voltage of the transistor MP7 becomes smaller and the latter thus obtains a lower conductivity between drain and source. The gate-source voltage at the transistor MN7, signal A, is set to the voltage vdd. The transistor MN7 has the task of pulling the voltage of the signal xsg to 0 volt from the terminal HVP. In contrast, the transistor MP7, which wants to hold the voltage of the signal xsg at the level at the terminal HVP has become weaker and thus facilitates the discharging of the signal xsg. It is only when the signal xsg is low enough that, on the one hand, the signal gsg is pulled to the voltage at the terminal HVP by the transistor MP8 and the latch 50 is flipped into the "1" state and, on the other hand, the signal at the drive line SGL is charged to the voltage at the terminal HVP via the transistor MP9. The charging itself takes place without shunt current via the transistor MN9 since the latter has been switched off at the beginning of the procedure.

Ending the read process: the latch 52 is brought from the "1" state to the "0" state by the change in polarity of the signal A: the signal gsg is discharged to 0 V by the output $A_A$ of the driver 28 via the transistor MN8 which in this case has a greater conductivity than the transistor MP8. As a result, the transistor MP7 becomes conducting, the voltage of the signal xsg is pulled to the level at the terminal HVP by the transistor MP7 and the transistor MP9 is cut off. After that, the transistor MN9 is switched to conduct by a high level of the signal C and discharges the drive line SGL to 0 V without a shunt current flowing through the transistor MP9.

As can be seen from the above information, it is sensible to use both one/several control gate drivers and one/several select gate drivers of the type described above for operating an EEPROM cell or, respectively, an EEPROM cell array.

FIG. 12 shows a drive circuit 48 for a control gate driver 11 or 14 according to FIGS. 1 and 2 and a select gate driver 23 or 29 according to FIG. 4 or 5 for operating an EEPROM cell in the operating modes specified above.

As can be seen from the figure of the drawing, the drive circuit 24 comprises a charge pump 30 for providing a positive supply voltage vpp, a charge pump 32 for providing a negative programming voltage vprogn and a voltage regulator for providing a read voltage vread. A discharge circuit 33 is interposed between in each case a node 39 connected to the charge pump 30 for providing the positive supply voltage vpp and a node 40 connected to the voltage regulator 31 for providing the read voltage vread. Furthermore, a further discharge circuit 34 is interposed between a node 47 connected to the charge pump 32 for generating the negative programming voltage vprogn and ground 22.

The HVP terminal of the control gate driver 11, 14 is connected to a switch 35 which can be optionally connected via a node 41 to the charge pump 30 for the positive supply voltage vpp or via a node 42 to the voltage regulator 31 for the read voltage vread.

The HVN terminal of the control gate driver 11 or 14 is connected to a change-over switch 36 which can be optionally connected to the charge pump 30 for the positive high voltage vpp via a node 43 or to a switch 37 which itself can be optionally connected to the charge pump 32 for the negative programming voltage vprogn via a node 44 or to ground 22.

The HVP terminal of the select gate driver 23 or 29 is also connected to a switch 38 which can be optionally connected to the charge pump 30 for the positive supply voltage vpp via a node 45 or to the voltage regulator 31 for the read voltage vread via the node 46.

The drive circuit 48 as shown in FIG. 12 accordingly manages with only three charge pumps, namely those identified by the reference symbols 30 and 32 and one for driving the corresponding bit line(s), whereas the drive circuit according to the prior art additionally requires two charge pumps in order to provide so-called boost voltage vboost for driving the high-voltage decoupling transistors 8, 18.

The corresponding control or select gate drivers according to the invention can be operated in the various operating modes with the aid of the circuit arrangement 48 according to FIG. 12 as follows:

Control Gate Driver 11 According to FIG. 1:

Read Mode:
a) The switches 35 to 38 are in positions xE and xP, respectively. Thus, the terminal HVP is at read voltage vread, the terminal HVN is at 0 V. The charge pumps 30, 32 are switched off.
b) Applying the logic state "1" to the low-voltage signal (Sel).
The read mode has thus been achieved.

Erase Mode:
a) Switches 35 to 38 are in positions xE and xP, respectively. The terminal HVP is thus at the read voltage vread, the terminal HVN is at 0 V. The charge pumps are switched off.
b) Selection of the sectors to be erased by switching the sector erase select switches 35 and 36 (there is one pair for each sector) from xE to E.
c) Switching on the charge pump VPP 30 and ramping the voltage up to the erase voltage vpp.
d) After the end of the erase time, discharging the voltage via DisCh 33 to the read voltage level Vread.
e) Switching the sector erase select switches 35 and 36 from E to xE.
The desired sector has thus been erased.

Program Mode:
a) The switches 35 to 38 are in positions xE and xP, respectively. Thus, the read voltage vread is present at the terminal HVP, the terminal HVN is at 0 V. The charge pumps are switched off.
b) Selecting the word line to be programmed by Sel="0". If the word line is not selected, Sel="1".
c) Switching the program select switches 37 and 38 from xP to P.
d) Switching the charge pump VProgN 32 on and ramping the voltage up to the negative programming voltage vprogn.
e) After the end of the programming time, discharging the voltage via DisCh 34 to 0 V.
f) Switching the programming select switches 37 and 38 from P to xP.
Thus, the memory cells of the selected word line at which a positive programming voltage vprogp was additionally applied to the drains by a circuit, not described here, during this process are programmed.

Control Gate Driver 14 According to FIG. 2:

Read Mode:
a) The switches 35 to 38 are in positions xE and xP, respectively. Thus, the terminal HVP is at the vread voltage, the terminal HVN is at 0 V. The charge pumps are switched off.
b) Applying the logic state "1" to the low voltage signal Sel.
The read mode has thus been achieved.

Erase Mode:
a) The switches 35 to 38 are in positions xE and xP, respectively. Thus, the read voltage vread is present at the terminal HVP, the terminal HVN is at 0 V. The charge pumps are switched off.

b) Selection of the sectors to be erased by switching the sector erase select switches 35 and 36 (there is one pair for each sector) from xE to E.
c) Switching on the charge pump VPP 30 and ramping the voltage up to the erase voltage vpp.
d) After the end of the erase time, discharging the voltage via DisCh 33 to the read voltage level vread.
e) Switching the sector erase select switches 35 and 36 from E to xE.

The desired sector has thus been erased.

Program Mode:
a) The switches 35 to 38 are in positions xE and xP, respectively. Thus, HVP is at the read voltage vread, HVN is at 0 V. The charge pumps are switched off.
b) Selecting the word line to be programmed by Sel=0. If the word line is not selected, Sel=1.
c) Switching the program select switches 37 and 38 from xP to P.
d) Switching on the charge pump VProgN 32 and ramping the voltage up to the negative programming voltage vprogn.
e) After the end of the programming time, discharging the voltage via DisCh 34 to 0 V.
f) Switching the program select switches 37 and 38 from P to xP.

Thus, the memory cells of the selected word line at which a positive programming voltage vprogp has been additionally applied to the drains by a circuit, not described here, during this process are programmed.

Select Gate Driver 23 According to FIG. 4:

Read Mode:
a) The switch 38 is in position xP. The terminal HVP is thus at the voltage vread. The charge pumps are switched off.
b) Selecting the word line to be read by applying the address to the address decoder. The signal SEL_N from the address decoder and control signals in 24 and 27 produce a signal sequence at "A", "B" and "C" as outlined in FIG. 4b. The circuit 50/51 charges the selected word line SGL to vread for a time predetermined by "A", "B" and "C". As long as SGL is charged to vread, it is possible to read from the word line.

Erase Mode:
The switch 38 is in position xP. Thus, HVP is at vread, HVN is at 0 V. This state is retained during the erase process.

Program Mode:
a) The switch 38 is in position xP. HVP is thus at vread.
b) Selecting the word line to be programmed by Sel=1. If the word line is not selected, Sel=0.
c) Switching the program select switch 38 from xP to P.
d) Switching on the charge pump VPP 30 and ramping the voltage up to the positive voltage vboost.
e) After the end of the programming time, discharging the voltage via DisCh 33 to vread.
f) Switching the program select switch 38 from P to xP.

Thus, the memory cells of the selected word line at which a positive programming voltage vprogp has been additionally applied to the drains by a circuit, not described here, during this process are programmed.

Select Gate Driver 29 According to FIG. 5:

Read Mode:
a) The switch 38 is in position xP. Thus, the terminal HVP is at the voltage vread. The charge pumps are switched off.
b) Selecting the word line to be read by applying the address to the address decoder. The signal SEL_N from the address decoder and control signals in 24 and 28 produce a signal sequence at "A" and "C" as outlined in FIG. 5b. The circuit 52/51 charges the selected word line SGL to vread for a time predetermined by "A" and "C". As long as SGL is charged to vread, it is possible to read from the word line.

Erase Mode:
The switch 38 is in position xP. Thus, HVP is at vread, HVN is at 0 V. This state is retained during the erase process.

Program Mode:
a) The switch 38 is in position xP. HVP is thus at vread.
b) Selecting the word line to be programmed by Sel=1. If the word line is not selected, Sel=0.
c) Switching the program select switch 38 from xP to P.
d) Switching on the charge pump VPP 30 and ramping the voltage up to the positive voltage vboost.
e) After the end of the programming time, discharging the voltage via DisCh 33 to vread.
f) Switching the programming select switch 38 from P to xP.

Thus, the memory cells at which a positive programming voltage vprogp has been additionally applied to the drains by a circuit, not described here, during this process are programmed.

LIST OF REFERENCE DESIGNATIONS

1 Cell array
2 Selected memory cell
3 Select transistor
4 Cell transistor
5 Tunnel window
6 HV latch
7 Control gate driver
8 High-voltage decoupling transistor
9 Low-voltage read driver/inverter
10 Word line decoder
11 Control gate driver
12 Word line decoder
13 Inverter
14 Control gate driver
15 High-voltage transistors
16 Low-voltage transistors
17 Select gate driver
18 High-voltage decoupling transistor (large)
19 Low-voltage read driver/inverter
20 Word line decoder
21 HV latch
22 Ground
23 Select gate driver
24 Word line decoder
25 High-voltage transistors
26 Low-voltage transistors
27, 28 Drive device
29 Select gate driver
30 Charge pump for positive supply voltage vpp
31 Voltage regulator for vread
32 Charge pump for negative program voltage vprogn
33, 34 Discharge circuit
35 Switch for VPP
36 Change-over switch VPP-VPN
37 Switch for VPN
38 Switch for VPP
39 Circuit node
40-47 Circuit nodes 48 Power switching device
49, 50 Latch
51 Level shifter
52, 53 Latch
$S_4$ Source of the cell transistor
$D_3$ Drain of the select transistor
$CG_4$ Control gate of the cell transistor
$SG_3$ Select gate of the select transistor
$FG_4$ Floating gate of the cell transistor
$WL_n$ n-th word line
$WL_{n-1}$ n−1-th word line
$BL_m$ m-th bit line
$BL_{m+1}$ m+1-th bit line
$U_{th}$ Threshold voltage of the cell transistor
$CGL_n$ Drive line for gates of the cell transistors of the n-th word line
$CGL_{n-1}$ Drive line for gates of the cell transistors of the n−1-th word line
$SGL_n$ Drive line for gates of the select transistors of the n-th word line
$SGL_{n-1}$ Drive line for gates of the select transistors of the n−1-th word line
$S_m$ Drive line for sources of the cell transistors of the m-th bit line
$S_{m+1}$ Drive line for sources of the cell transistors of the m+1-th bit line
CGL Drive line for gates of the cell transistors of one word line
G8 Gate of the HV decoupling transistors
SEL_N Control signal from the address decoder
SGL Drive line for gates of the select transistors of one word line
vread Read voltage
CON Control voltage
HVP Terminal for positive high voltage
HVN Terminal for negative high voltage
I1 First inverter
I2 Second inverter
MP1 PMOS transistor
MP2 PMOS transistor
MN1 NMOS transistor
MN2 NMOS transistor
KN1 Circuit node
KP1 Circuit node
RL Feedback line
KN2 Circuit node
KP2 Circuit node
MP3 PMOS transistor
MP4 PMOS transistor
MN3 NMOS transistor
MN4 NMOS transistor
Sel Select signal
KSel Circuit node
K3-K5 Circuit node
MN5 NMOS transistor
MN6 NMOS transistor
G18 Gate of the HV decoupling transistor
sgi Signal at the output of the low-voltage driver
GND Ground
MP7 PMOS transistor
MN7 NMOS transistor
MP8 PMOS transistor
MN8 NMOS transistor
MP9 PMOS transistor (large)
MN9 NMOS transistor (large)
K6-K9 Circuit nodes
VL Connecting line
K10 Circuit node
K11 Circuit node
$A_A$-$A_C$ Output
$E_A$-$E_C$ Input
$E_{VDD}$ Input
vdd Supply voltage of the digital section, low voltage
$E_{13}$ Input
$A_{13}$ Output
$A_{12}$ Output
$A_{24}$ Output
$E_{27}$ Input
$E_{28}$ Input
A-C Signal
DisCh Discharge circuit
vpp First charge pump, generates the positive erase voltage vpp or the voltage vboost
vprogn Second charge pump, generates the negative program voltage vprogn
vprogp Third charge pump, generates the positive program voltage vprogp for the bit lines
$E_{49}$ Latch input
$A_{49}$ Latch output
$A_{50}$ Latch input
$E_{53}$ Latch input
$A_{53}$ Latch output
$E_{51}$ Level shifter input
$A_{51}$ Level shifter output
Selinv Inverted select signal
t Time
$t_1$-$t_{10}$ Time
gsg Signal at the internal node in the HV latch
xsg Signal at the internal node in the HV latch
$I_{SG}$ Current intensity select gate
vpp Positive erase voltage
vprogn Negative program voltage
vprogp Positive program voltage
vboost Boost voltage

The invention claimed is:

1. A circuit arrangement for switching high-voltage signals with low-voltage signals, particularly for driving a semiconductor memory arrangement, comprising:
 a low-voltage logic device configured to generate at least one low-voltage signal with a first predetermined logic level (0) and with a second predetermined logic level (1); and
 a latch configured to receive and latch the at least one low-voltage signal and to generate an output signal having a voltage (vdd) dependent on the logic level of the received low-voltage signal, the latch comprising:
  a level shifter configured to increase the value of the voltage of the latched low-voltage signal to a voltage of a high-voltage signal, such that the voltage of the output signal substantially to the voltage of the high-voltage signal; and
  one or more high-voltage transistors;
 wherein the low-voltage logic device is operably connected only to one or more gates of one or more of the one or more high-voltage transistors when driving the latch with the low-voltage signals and the low-voltage logic device is connected to at least a drain or to a source of one or more of the one or more high-voltage transistors only when the latter is or are simultaneously operated in a common-gate configuration.

2. The circuit arrangement of claim 1, wherein the circuit arrangement comprises a control gate driver for a cell transistor of an electrically erasable and then reprogrammable read only memory, and further wherein the latch comprises:
a first and a second high-voltage PMOS transistor;
a first and a second high-voltage NMOS transistor;
a low-voltage inverter;
an input for receiving the at least one low-voltage signal; and
an output for outputting the output signal;
wherein the input of the latch is operably connected to an input of the low-voltage inverter and to a gate of the first high-voltage PMOS transistor;
wherein an output of the low-voltage inverter is operably connected to a gate of the second high-voltage PMOS transistor;
wherein a source of the first high-voltage PMOS transistor and a source of the second high-voltage PMOS transistor are operably connected to one another via a first circuit node for supplying a positive high-voltage signal;
wherein a source of the first high-voltage NMOS transistor and a source of the second high-voltage NMOS transistor are operably connected to one another via a second circuit node for supplying a negative high-voltage signal (HVN);
wherein a drain of the first high-voltage PMOS transistor, a drain of the first high-voltage NMOS transistor and a gate of the second high-voltage NMOS transistor are operably connected to one another; and
wherein a drain of the second high-voltage PMOS transistor, a drain of the second high-voltage NMOS transistor and a gate of the first high-voltage NMOS transistor are operably connected to the output of the latch.

3. The circuit arrangement of claim 1, wherein the circuit arrangement comprises a control gate driver for a cell transistor of an electrically erasable and then reprogrammable read only memory, and further wherein the latch comprises:
a first and a second high-voltage PMOS transistor;
a first, a second, a third, and a fourth high-voltage NMOS transistor;
a low-voltage inverter;
an input for receiving the low-voltage signal; and
an output for outputting the output signal;
wherein the input of the latch is operably connected to an input of the low-voltage inverter, to a gate of the first high-voltage PMOS transistor and to a gate of the third high-voltage NMOS transistor;
wherein an output of the low-voltage inverter is operably connected to a gate of the second high-voltage PMOS transistor and to a gate of the fourth high-voltage NMOS transistor;
wherein a source of the first high-voltage PMOS transistor and a source of the second high-voltage PMOS transistor are operably connected to one another via a first circuit node for supplying a positive high-voltage signal;
wherein a source of the first high-voltage NMOS transistor and a source of the second high-voltage NMOS transistor are operably connected to one another via a second circuit node for supplying a negative high-voltage signal;
wherein a source of the third high-voltage NMOS transistor is operably connected to a drain of the first high-voltage NMOS transistor;

wherein a source of the fourth high-voltage NMOS transistor is operably connected to a drain of the second high-voltage NMOS transistor;
wherein a drain of the first high-voltage PMOS transistor, a drain of the third high-voltage NMOS transistor and a gate of the second high-voltage NMOS transistor are operably connected to one another; and
wherein a drain of the second high-voltage PMOS transistor, a drain of the fourth high-voltage NMOS transistor and a gate of the first high-voltage NMOS transistor are operably connected to the output of the latch.

4. The circuit arrangement of claim 1, wherein the circuit arrangement comprises a select gate driver for a select transistor of an electrically erasable and then reprogrammable read only memory, and further wherein the latch comprises:
a first and a second high-voltage PMOS transistor;
a first and a second high-voltage NMOS transistor;
a first input for receiving a first low-voltage signal;
a second input for receiving a second low-voltage signal; and
an output for outputting a signal to the level shifter;
wherein the first input of the latch is operably connected to a gate of the first high-voltage NMOS transistor;
wherein the second input of the latch is operably connected to a gate of the second high-voltage NMOS transistor;
wherein a source of the first high-voltage PMOS transistor and a source of the second high-voltage PMOS transistor are operably connected to one another via a first circuit node for supplying a positive high-voltage signal;
wherein a source of the first high-voltage NMOS transistor and a source of the second high-voltage NMOS transistor are operably connected to one another via a second circuit node for supplying a zero voltage signal;
wherein a drain of the second high-voltage PMOS transistor, a drain of the second high-voltage NMOS transistor and a gate of the first high-voltage PMOS transistor are operably connected to one another; and
wherein a drain of the first high-voltage PMOS transistor, a drain of the first high-voltage NMOS transistor and a gate of the second high-voltage PMOS transistor are operably connected to the output of the latch.

5. The circuit arrangement as claimed in claim 4, wherein the level shifter includes:
a third high-voltage PMOS transistor;
a third high-voltage NMOS transistor;
a first input for receiving a high-voltage signal;
a second input for receiving a third low-voltage signal to be latched by the latch; and
an output for outputting the output signal;
wherein a source of the third high-voltage PMOS transistor is operably connected to the source of the first high-voltage PMOS transistor and the source of the second high-voltage PMOS transistor;
wherein a source of the third high-voltage NMOS transistor is operably connected to the source of the first high-voltage NMOS transistor and the source of the second high-voltage NMOS transistor; and
wherein the first input is operably connected to the output of the latch for supplying the high-voltage signal.

6. The circuit arrangement as claimed in claim 5, wherein the low-voltage logic device is configured to prevent, in a predetermined operating mode, the third high-voltage PMOS transistor and the third high-voltage NMOS transistor from simultaneously conducting.

7. The circuit arrangement as claimed in claim 6, wherein the low-voltage logic device is configured to:
apply the first low-voltage signal and the second logic level to the first input of the latch at a first time;
apply the second low-voltage signal and the first logic level to the second input of the latch at the first time;
apply the third low-voltage signal to be latched by the latch and the first logic level to the second input of the level shifter at the first time ($t_1$);
apply the first low-voltage signal and the first logic level to the first input of the latch at a third time following the first time;
apply the second low voltage signal and the second logic level to the second input of the latch at the third time; and
apply the third low-voltage signal to be latched by the latch and the second logic level to the second input of the level shifter at a fourth time following the third time.

8. The circuit arrangement as claimed in claim 1, wherein the circuit arrangement comprises a select gate driver for a select transistor of an electrically erasable and then reprogrammable read only memory, and further wherein the latch comprises:
a first and a second high-voltage PMOS transistor;
a first and a second high-voltage NMOS transistor;
a first input for receiving a first low-voltage signal;
a second input for receiving a second low-voltage signal; and
an output for outputting a signal to the level shifter;
wherein the first input of the latch is operably connected to a gate of the first high-voltage NMOS transistor and a source of the second high-voltage NMOS transistor;
wherein the second input of the latch is operably connected to a gate of the second high-voltage NMOS transistor;
wherein a source of the first high-voltage PMOS transistor and a source of the second high-voltage PMOS transistor are operably connected to one another via a first circuit node for supplying a positive high-voltage signal;
wherein a source of the first high-voltage NMOS transistor is operably connected to one another via a second circuit node for supplying a zero voltage signal;
wherein a drain of the second high-voltage PMOS transistor (MP8), a drain of the second high-voltage NMOS transistor and a gate of the first high-voltage PMOS transistor (MP7) are operably connected to one another; and
wherein a drain of the first high-voltage PMOS transistor, a drain of the first high-voltage NMOS transistor and a gate of the second high-voltage PMOS transistor are operably connected to the output of the latch.

9. The circuit arrangement as claimed in claim 8, wherein the level shifter includes:
a third high-voltage PMOS transistor;
a third high-voltage NMOS transistor;
a first input for receiving a high-voltage signal;
a second input for receiving a third low-voltage signal to be latched by the latch; and
an output for outputting the output signal;
wherein a source of the third high-voltage PMOS transistor is operably connected to the source of the first high-voltage PMOS transistor and the source of the second high-voltage PMOS transistor;
wherein a source of the third high-voltage NMOS transistor is operably connected to the source of the first high-voltage NMOS transistor; and
wherein the first input of the level shifter is operably connected to the output of the latch for supplying the high-voltage signal.

10. The circuit arrangement as claimed in claim 9, wherein the low-voltage logic device is configured to prevent, in a predetermined operating mode, the third high-voltage PMOS transistor and the third high-voltage NMOS transistor from simultaneously conducting.

11. The circuit arrangement as claimed in claim 10, wherein the low-voltage logic device is configured to:
apply the first low-voltage signal and the second logic level to the first input of the latch at a first time;
apply essentially continuously the second low-voltage signal and the first logic level to the second input of the latch at the first time;
apply the third low-voltage signal to be latched by the latch and the first logic level to the second input of the level shifter at the first time;
apply the first low-voltage signal and the first logic level to the first input of the latch at a third time following the first time;
apply the second low voltage signal and the second logic level to the second input of the latch at the third time; and
apply the third low-voltage signal to be latched by the latch and the second logic level to the second input of the level shifter at a fourth time following the third time.

12. A method for operating a circuit arrangement for switching high-voltage signals with low-voltage signals, the method comprising:
generating at least one low-voltage signal having a logic level;
receiving and latching the at least one low-voltage signal using a latch, the latch including one or more high-voltage transistors;
adjusting an output voltage using a level shifter such that the output voltage is adjusted to a voltage at a positive high-voltage node or a negative high-voltage node depending on the logic level of the received low-voltage signal;
outputting an output signal that corresponds to the adjusted latched low-voltage signal; and
driving at least one gate of the one or more high-voltage transistors of the latch with the at least one low-voltage signal.

13. The method of claim 12, wherein the adjusting a voltage of the latched low-voltage signal step further comprises:
adjusting the voltage of the latched low-voltage signal to the voltage at the positive high-voltage node when the logic level of the latched low-voltage signal is "1"; and
adjusting the voltage of the latched low-voltage signal to the voltage at the negative high-voltage node when the logic level of the latched low-voltage signal is "0".

14. The method of claim 13, further comprising:
applying a read voltage to the positive high-voltage node;
applying 0 volts to the negative high-voltage node; and
generating the at least one low-voltage signal with a logic level "1".

15. The method of claim 13, further comprising:
applying a read voltage to the positive high-voltage node;
applying the read voltage to the negative high-voltage node;

increasing the voltage at the positive high-voltage node and the negative high-voltage node to an erase voltage; and after an erase time has elapsed, reducing the voltage at the positive high-voltage node and the negative high-voltage node to the read voltage.

16. The method of claim 13, further comprising:

applying a read voltage to a positive high-voltage node of the latch;

applying 0 volts to a negative high-voltage node of the latch;

generating the at least one low-voltage signal with a logic level "0"; and after a programming time has elapsed, adjusting the voltage at the negative high-voltage node to 0 volt.

17. The method of claim 12, wherein the generating at least one low-voltage signal step comprises generating a first, second and third low-voltage signal; and wherein the adjusting an output voltage step further comprises:
adjusting the output voltage to the voltage at the positive high-voltage node when the logic level of the first low-voltage signal is "1", approximately simultaneously with the logic levels of the second and third low-voltage signals being "0"; and
adjusting the output voltage to the voltage at the negative high-voltage node when the logic level of the first low-voltage signal is "0" approximately simultaneously with the logic levels of the second and third low-voltage signals being "1".

18. The method of claim 17, further comprising:

applying a read voltage to the positive high-voltage node;

generating the first low-voltage signal with a logic level "1" and the second and third low-voltage signals with a logic level "0" at a first time;

generating the first low-voltage signal with a logic level "0" and the second low-voltage signal with a logic level "1" at a third time following the first time; and generating the third low-voltage signal with a logic level "1" at a fourth time following the third time.

19. The method of claim 17, further comprising:

applying a read voltage to the positive high-voltage node;

generating the first low-voltage signal with a logic level "1" and the second and third low voltage signals with a logic level "0" at a first time;

increasing the voltage at the positive high-voltage node to a positive boost voltage;

after a programming time has elapsed, reducing the voltage at the positive high-voltage node to the read voltage.

* * * * *